(12) United States Patent
Nagata et al.

(10) Patent No.: US 9,356,254 B2
(45) Date of Patent: May 31, 2016

(54) ORGANIC EL DISPLAY DEVICE AND METHOD FOR PRODUCING THE SAME

(71) Applicant: Japan Display Inc., Tokyo (JP)

(72) Inventors: Tetsuya Nagata, Tokyo (JP); Takumi Kuji, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/574,762

(22) Filed: Dec. 18, 2014

(65) Prior Publication Data

US 2015/0179975 A1    Jun. 25, 2015

(30) Foreign Application Priority Data

Dec. 24, 2013   (JP) .................................. 2013-266086

(51) Int. Cl.
*H01L 29/08*    (2006.01)
*H01L 51/52*    (2006.01)
*H01L 27/32*    (2006.01)

(52) U.S. Cl.
CPC .......... *H01L 51/5246* (2013.01); *H01L 51/524* (2013.01); *H01L 51/5253* (2013.01); *H01L 27/3213* (2013.01); *H01L 51/5284* (2013.01)

(58) Field of Classification Search
CPC .............. H01L 51/5246; H01L 27/322; H01L 51/5284; H01L 51/56; H01L 51/5237; H01L 51/524; H01L 51/3295
See application file for complete search history.

(56) References Cited

U.S. PATENT DOCUMENTS

2005/0275342 A1*  12/2005  Yanagawa ............. H01L 27/322
                                                          313/504
2007/0121054 A1*   5/2007  Jang ...................... G02F 1/1341
                                                          349/187
2011/0156571 A1*   6/2011  Lin ..................... H01L 51/5246
                                                          313/317

FOREIGN PATENT DOCUMENTS

JP          2001-338754 A      12/2001

* cited by examiner

*Primary Examiner* — Khiem D Nguyen
(74) *Attorney, Agent, or Firm* — Typha IP LLC

(57) ABSTRACT

A method includes: forming, in a first substrate, a display area in which a plurality of pixels including an organic EL light-emitting layer are arrayed; forming, in a second substrate, a plurality of opening areas respectively located in correspondence with the plurality of pixels and a light-blocking area that demarcates the plurality of opening areas; providing a dam material such that the dam material encloses the display area; dripping a filler material to an area enclosed by the dam material; and attaching the first substrate and the second substrate to each other, and fusing together dripped portions of the filler material, thereby bonding the both substrates to each other. The both substrates are attached to each other while being positionally aligned such that borders between the dripped portions of the filler material that is generated by the fusion are located in an area corresponding to the light-blocking area.

6 Claims, 10 Drawing Sheets

(a)

(b)

(a)

(b)

(c)

(a)

(b)

(a)

(b)

(c)

(a)

(b)

(c)

(a)

(b)

(c)

(d)

ORGANIC EL DISPLAY DEVICE AND METHOD FOR PRODUCING THE SAME

CROSS-REFERENCE TO RELATED APPLICATIONS

This application is based upon and claims the benefit of priority from the prior Japanese Patent Application No. 2013-266086, filed on 24 Dec. 2013, the entire contents of which are incorporated herein by reference.

FIELD

The present invention relates to an organic EL (electroluminescence) display device including a sealing unit for an organic EL light-emitting layer, and a method for producing the same.

BACKGROUND

Recently, organic EL display devices have been progressively developed for decreasing the thickness, raising the luminance and increasing the operation speed of display panels. An organic EL display device is a display device including pixels formed of organic light-emitting diodes. The organic EL display device has high response speed because no mechanical operation is needed, is capable of providing high luminance display because each pixel itself emits light, and can have reduced thickness because a backlight unit is not needed. For these reasons, the organic EL display device is favorably expected to be a next-generation display device.

In such an organic EL display device, an organic EL light-emitting layer is rapidly deteriorated when being exposed to moisture and thus needs to be shielded against external air. Therefore, some conventional organic EL display devices have a structure in which a surface of the organic EL light-emitting layer is covered with a sealing film and bonded to a counter substrate, including color filters or the like, with a transparent resin being sandwiched between the organic EL light-emitting layer and the counter substrate (see, for example, Patent Literature 1, "Japanese Laid-Open Patent Publication No. 2001-338754").

A conventionally known method for producing an organic EL display device having such a structure is as follows. As shown in FIG. 9, resins 4 and 5 are dripped onto a substrate 7, including an organic EL light-emitting layer, to form dot portions, and a counter substrate 6 is attached to the substrate 7 while the resins 4 and 5 are sandwiched between the substrates. The resins 4 and 5 are pushed and expanded, and are cured to bond the two substrates.

However, the above-described conventional method for producing the organic EL display device has the following problem. As shown in FIG. 10, the resin 5 is dripped to form a plurality of dot portions 5a, and the dot portions 5a are pushed and expanded by the step of attaching the substrate 7 and the counter substrate 6 to each other. As a result, the dot portions 5a adjacent to each other are fused together, and borders along which the dot portions 5a are fused together may appear as striped display irregularities 55z. As shown in FIG. 10, such display irregularities 55z are visually recognized as lattice-like display irregularities 55z, which may deteriorate the image quality of the organic EL display device.

In Patent Literature 1, the display irregularities 55z as shown in FIG. 10 are considered to be caused by stress that is generated when the resin 5 is cured and contracted. Thus, the organic EL display device described in Patent Literature 1 includes an organic film between the substrates 6 and 7 in order to alleviate the stress, in addition to the resin sealing film. However, such a structure enlarges the gap between the substrate 7 and the counter substrate 6. When the organic EL display device is observed in an oblique direction, light emitted by the organic EL light-emitting layer is not transmitted through a corresponding color filter but is transmitted through an adjacent color filter. This may cause color mixing in the pixels. In addition, the structure in which a plurality of layers are provided between the substrates 6 and 7 obstructs thickness reduction of the organic EL display device and size reduction of the pixels, and also may complicate the production steps and raise the production cost.

SUMMARY

A method for producing an organic EL display device in an embodiment according to the present invention includes: forming, as a component of a first substrate, a display area in which a plurality of pixels including an organic EL light-emitting layer are arrayed; forming, as components of a second substrate, a plurality of opening areas respectively located in correspondence with the plurality of pixels and a light-blocking area that demarcates the plurality of opening areas; forming a sealing film so as to cover the organic EL light-emitting layer in the first substrate; providing a dam material on the sealing film such that the dam material encloses the display area; dripping a filler material to an area enclosed by the dam material by use of a jet dispenser or an inkjet device; and attaching the first substrate and the second substrate to each other while the dam material and the filler material are sandwiched between the first substrate and the second substrate, and fusing together dripped portions of the filler material that are adjacent to each other, thereby bonding the first substrate and the second substrate to each other. The first substrate and the second substrate are attached to each other while being positionally aligned such that borders between the dripped portions of the filler material that is generated by the fusion is located in an area corresponding to the light-blocking area.

The opening areas may each include a color filter; and the light-blocking area may include a black mask.

The filler material may be dripped at a dripping pitch that is shorter than or equal to 100 μm.

An organic EL display device in an embodiment according to the present invention includes: a first substrate including a display area in which a plurality of pixels including an organic EL light-emitting layer are arrayed; a second substrate that faces the first substrate and includes a plurality of opening areas respectively located in correspondence with the plurality of pixels and a light-blocking area that demarcates the opening areas; a dam material provided between the first substrate and the second substrate so as to enclose the display area; and a filler material filling a space enclosed by the first substrate, the second substrate and the dam material. The filler material includes borders generated as a result of a plurality of portions of the filler material being fused together; and the borders of the filler material are located in an area corresponding to the light-blocking area.

DESCRIPTION OF EMBODIMENTS

The present invention is to solve the problems of a conventional structure and has an object of providing an organic EL display device having improved image quality and realizing high definition display. The present invention also has an object of providing a method for producing such an organic EL display device at low cost.

Hereinafter, an embodiment of the present invention will be described with reference to the drawings. The present invention is not limited to the following embodiment and may be carried out in any of various forms without departing from the gist thereof.

Figure 1:
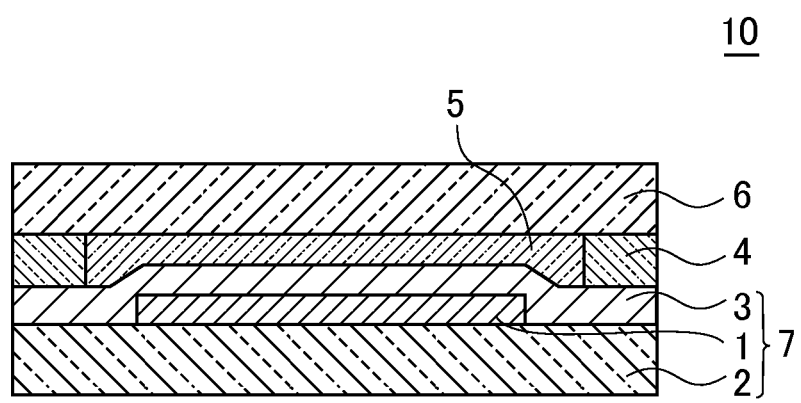
FIG. 1 is a cross-sectional view schematically showing a stack structure of an organic EL display device in an embodiment according to the present invention.

FIG. 1 is a vertical cross-sectional view showing an example of stack structure of an organic EL display device 10 in an embodiment according to the present invention. As shown in FIG. 1, an organic EL light-emitting layer 1 is formed on a transparent substrate 2 formed of glass or the like. Although not shown in detail in FIG. 1, the organic EL light-emitting layer 1 may include, for example, a TFT driving circuit layer, a reflection electrode, a hole injection layer, a hole transport layer, a light-emitting layer, an electron transport layer, an electron injection layer, and a transparent electrode that are stacked in this order from the side of the substrate 2.

The organic EL light-emitting layer 1 is rapidly deteriorated when being exposed to moisture, and thus needs to be shielded against external air. Therefore, a surface of the organic EL light-emitting layer 1 is covered with, for example, a transparent sealing film 3 including a SiN film formed by CVD. Hereinafter, a substrate 7 including the organic EL light-emitting layer 1 and the sealing film 3 will be referred to as a "first substrate". In FIG. 1, the first substrate 1 includes the substrate 2, and the organic EL light-emitting layer 1 and the sealing film 3 that are provided on the substrate 2.

The first substrate 7 including the organic EL light-emitting layer 1 and the sealing film 3 is further covered with a sealing substrate (hereinafter, referred to as a "second substrate") 6 so that the organic layer is shielded against external air. Although not shown in detail in FIG. 1, the second substrate 6 may include a color filter, a thin film device having a touch-panel function (e.g., touch sensor) or the like formed on a transparent member formed of glass or the like.

A gap between the first substrate 7 and the second substrate 6 is filled with transparent resins 4 and 5 such as epoxy resins or the like (ultraviolet-curable resin, thermosetting resin, etc.). Owing to this, the second substrate 6 and the first substrate 7 can be bonded to each other while being distanced from each other by a certain length. This can keep a surface of the first substrate 7 and a surface of the second substrate 6 parallel to each other and prevent reflection and refraction at an interface between the surfaces.

Figure 2:
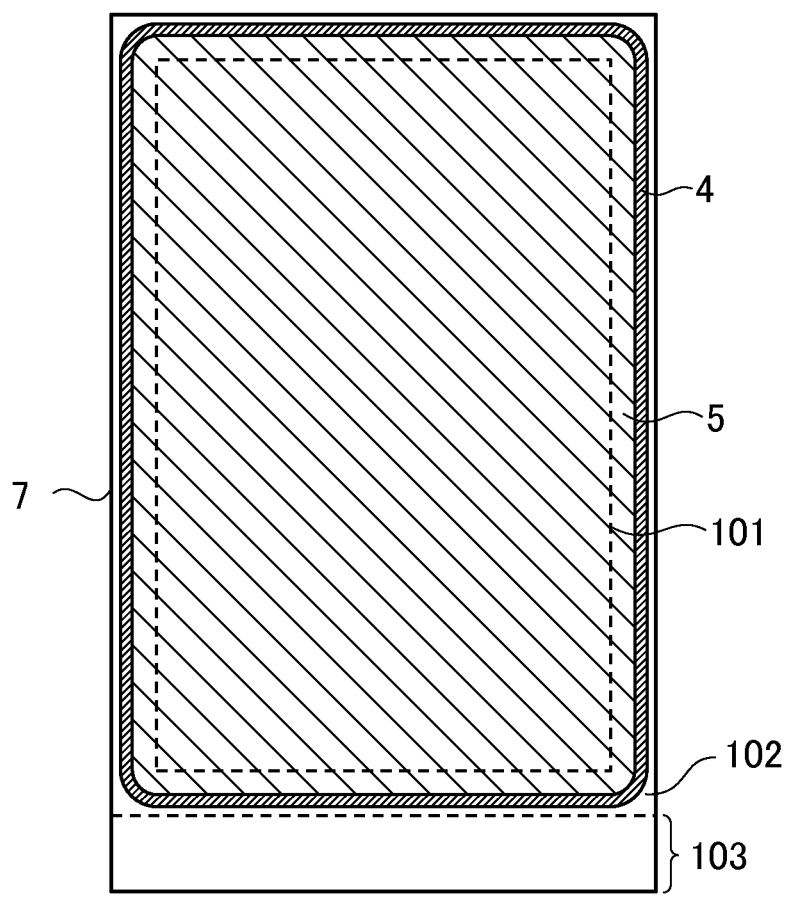
FIG. 2 is a planar see-through view showing a schematic structure of the organic EL display device in an embodiment according to the present invention.

FIG. 2 shows a schematic structure of the organic EL display device 10 in an embodiment according to the present invention. Specifically, FIG. 2 is a planar see-through view of the organic EL display device 10 showing a shape of the surface of the first substrate 7 and also showing the second substrate 6 seen through the first substrate 7.

As shown in FIG. 2, the organic EL display device 10 in an embodiment according to the present invention includes a display area 101 in which a plurality of pixels including an organic EL light-emitting layer are arrayed, a frame area 102 that is an area outer to the display area 101, and a terminal area 103 in which terminals that electrically connect the organic EL display device 10 to an external element are located.

On the first substrate 7, the resin 4 having relatively high pre-curing viscosity is located in the frame area 102. A space enclosed by the resin 4 is filled with the resin 5 having relatively low pre-curing viscosity. Since the resin 4 having relatively high pre-curing viscosity encloses the resin 5 having relatively low pre-curing viscosity, the resin 5 having relatively low viscosity can be prevented from flowing outside even before being cured, while being expanded over the surface of the first substrate 7 uniformly. Hereinafter, because of such a function difference between the resins 4 and 5, the resin 4 having relatively high pre-curing viscosity will be referred to as a "dam material", and the resin 5 having relatively low pre-curing viscosity will be referred to as a "filler material".

Figure 3:
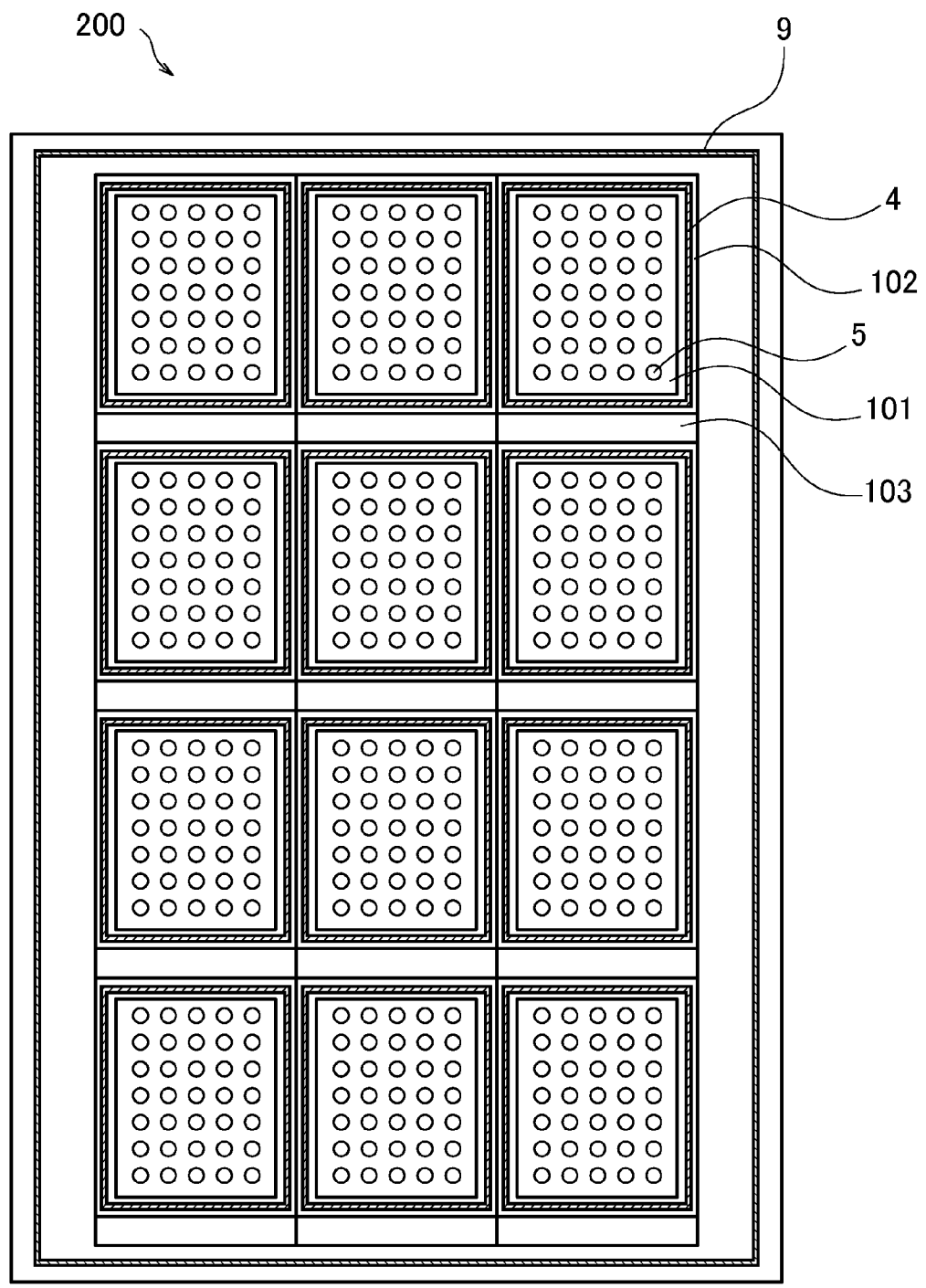
FIG. 3 shows a production step of the organic EL display device in an embodiment according to the present invention.

Now, with reference to FIG. 3, a step of attaching the first substrate 7 and the second substrate 6 by use of the dam material 4 and the filler material 5 will be described. FIG. 3 shows a production step of the organic EL display device 10 in an embodiment according to the present invention. Specifically, FIG. 3 shows a production substrate 200, which includes a plurality of the first substrates 7 formed integrally. FIG. 3 also shows positions on the production substrate 200, at which the dam material 4, the filler material 5 and a peripheral seal 9 are applied.

Generally for producing organic EL display devices, a plurality of device patterns are formed on one glass substrate in consideration of productivity. In a similar manner, one production substrate includes a plurality of the second substrates 6 formed integrally. Hereinafter, the production substrate 200 shown in FIG. 3 will be described as a substrate including the first substrates 7. Alternatively, the production substrate 200 may include the second substrates 6. The production substrate including the first substrates 7 formed integrally, and the production substrate including the second substrates 6 formed integrally, are bonded together, and then the resultant assembly is cut into a plurality of individual organic EL display devices 10.

The step of attaching the substrates is performed in a chamber that acts as a production device (not shown). In the production device (not shown), the dam material 4 is first applied to the production substrate 200 including the plurality of first substrates 7 formed integrally, by use of a device that ejects a certain amount of liquid, for example, a dispenser or the like.

The dam material 4 is applied to the frame areas 102, namely, along perimeters of rectangles, so as to enclose the display areas 101. In this embodiment, an ultraviolet-curable epoxy resin, for example, is used as the dam material 4. Although not shown in FIG. 3, a spacer material that keeps a certain distance between the first substrates 7 and the second substrates 6 may be optionally applied to the production substrate 200. As shown in FIG. 3, the peripheral seal 9 is applied to an area in the vicinity of an outer perimeter of the production substrate 200 including the plurality of first substrates 7 formed integrally. As the peripheral seal 9, the same material as that of the dam material 4 may be used.

Next, the filler material 5 is dripped onto the areas enclosed by the dam material 4 by use of a jet dispenser, an inkjet device or the like. In this embodiment, a thermosetting epoxy resin, for example, is used as the filler material 5. As shown in FIG. 3, the filler material 5 is dripped onto the areas enclosed by the dam material 4 to form dot portions. A reason why the filler material 5 forms dot portions is that the dripped filler material 5 assumes a spherical form because of the surface tension thereof. The filler material 5 is dripped such that the dot portions of the filler material 5 are distanced from each other by a certain regular interval and thus form a matrix.

In this embodiment, the filler material 5 is dripped by use of a jet dispenser or an inkjet device, so that the amount of the filler material 5 dripped each time can be smaller as compared with when a usual screw type dispenser or pressurized dispenser is used. The dripping pitch (distance between positions to which the filler material 5 is dripped) is decreased by such a method. Thus, even when the total amount of the filler material 5 is small under certain conditions, an appropriate amount of the filler material 5 can be dripped at appropriate positions over the entire areas enclosed by the dam material 4 with no filling defect. This can be rephrased as follows. The gap between the first substrate 7 and the second substrate 6 that are attached to each other depends on the total amount of the filler material 5 dripped; and even when the total amount of the filler material 5 is small, the filler material 5 can be expanded uniformly over the entire area enclosed by the dam material 4. Therefore, the first substrate 7 and the second substrate 6 can be bonded together while the gap therebetween is kept to certain narrowness. As can be seen, according to the production method in this embodiment, an organic EL display device having a narrow gap between the first substrate 7 and the second substrate 6 can be produced. Such an organic EL display device can prevent color mixing in the pixels and can also be thin.

Figure 10:
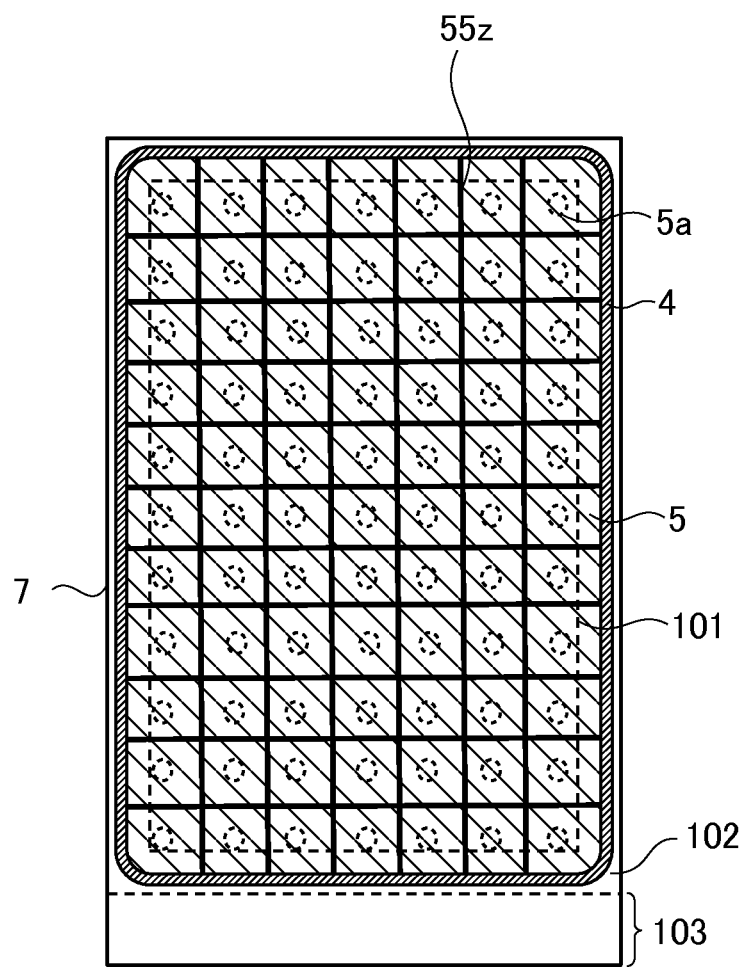
FIG. 10 shows a conventional organic EL display device.

The dripped filler material 5 is pushed and expanded by the step of attaching the substrates described later, and thus the adjacent dot portions of the filler material 5 are fused together. With the conventional technology, borders along which the dot portions of the filler material 5 are fused together often cause a fusing defect. This will be described specifically. When being pushed and expanded, the filler material 5 may undesirably incorporate, for example, a curing-inhibiting substance (substance that inhibits curing of the resin) that is present on the substrate but is not intended to be incorporated. As a result, the state of the filling material 5 at the borders is inferior to the state of the filling material 5 in the remaining area. In addition, since the state of the filler material 5 at the borders is different from the state of the filling material 5 in the remaining area, the filler material 5 at the borders may not be sufficiently cured when, for example, being irradiated with ultraviolet or heat-treated as described later. When such an area that is not sufficiently cured is heated by, for example, a reliability test or the like after the production of the organic EL display device 10 is finished, the filler material 5 at the borders is progressively cured and contracted. This applies a stress to the second substrate 6, and as a result, the display irregularities 55z as shown in FIG. 10 may be caused.

In this embodiment, in order to alleviate such a cause of the display irregularities 55z, a jet dispenser or an inkjet device as described above is used so that the dripping pitch of the filler material 5 is decreased. The dot portions of the dripped filler material 5 are fused within a short time, and thus the state of the filler material 5 at the borders can be better. In addition, the distance by which the dot portions of the filler material 5 are expanded by the time when the dot portions are fused together is shortened. Therefore, the amount of curing-inhibiting substance that may be incorporated into the filler material 5 on the substrate can be decreased. In the case where the dripping pitch of the filler material 5 that is dripped by use of a jet dispenser or an inkjet device is, for example, shorter than or equal to 100 μm, the display irregularities 55z are not visually recognized.

Therefore, the method for producing the organic EL display device 10 in an embodiment according to the present invention can alleviate the display irregularities 55z that may be visually recognized. In addition, the production steps can be simplified and the production cost can be reduced by use of an existing jet dispenser or inkjet device. As described above, the gap between the substrates 6 and 7 can be decreased to prevent color mixing in the pixels. Therefore, the resultant organic EL display device 10 can be thin and realize high definition display.

As described above, the filler material 5 is dripped onto the production substrate 200 by use of a jet dispenser or an inkjet device. After this, the production substrate 200 including the plurality of first substrates 7 formed integrally, and the production substrate including the plurality of second substrates 8 formed integrally, are located to face each other and attached to each other. The inner pressure of the chamber that accommodates the two production substrates is decreased, and the two substrates are positionally aligned to each other by use of, optionally, alignment marks formed on both of the substrates while the gap between the substrates is narrowed. As a result, the dam material 4 applied to the production substrate 200 is put into contact with the other production substrate, and spaces enclosed by the dam material 4 and the two substrates are formed. Then, the inner pressure of the chamber is made the atmospheric pressure, so that the two substrates can be pushed against each other at the atmospheric pressure. As a result, the filler material 5 expands in the spaces enclosed by the dam material 4 and the two substrates, and the areas defined by the dam material 4 are filled with the filler material 5. In order to prevent generation of air bubbles or vacuum reservoir, this step of attachment is completed before the viscosity of the dam material 4 and the viscosity of the filler material 5 are raised.

In this step, owing to the peripheral seal 9 on the production substrate 200, the areas enclosed by the peripheral seal 9 and the two substrates can be kept in a low-pressure state even after the atmospheric pressure is introduced. Therefore, the atmospheric pressure is directly applied to the dam material 4 around the display areas 101, which can prevent the dam material 4 from being invaded by the air and thus from being destroyed.

Next, the dam material 4 and the filler material 5 are cured. The dam material 4 is irradiated with ultraviolet to be cured, and then the attached substrates are put into a heat treatment furnace. In the heat treatment furnace, the filler material 5 and the dam material 4 are thermally cured.

By the above-described steps, the bonding of the substrates by use of the dam material 4 and the filler material 5 is completed. After the substrates are bonded together, the production substrates are cut by use of a known method such as a scribe-and-break method or the like to be separated into individual pieces. A part of each second substrate 6 that faces the terminal area 103 of the first substrate 7 is cut away and removed, and an external circuit such as a driver IC or the like is connected to each terminal area 103. Thus, individual organic EL display devices 10 as finished products are produced.

Figure 4:
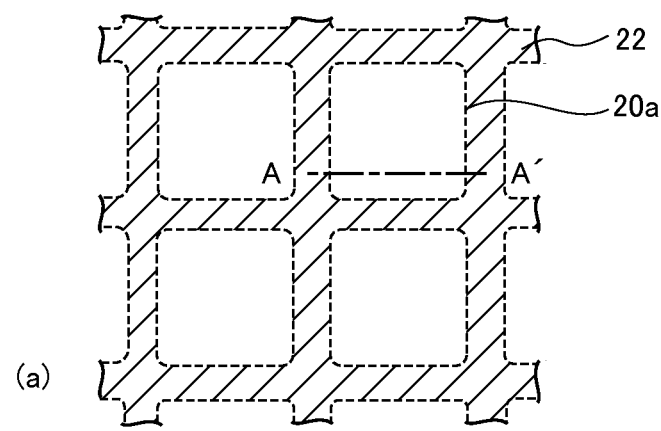
FIG. 4 shows production steps of the organic EL display device in an embodiment according to the present invention.
Figure 4:
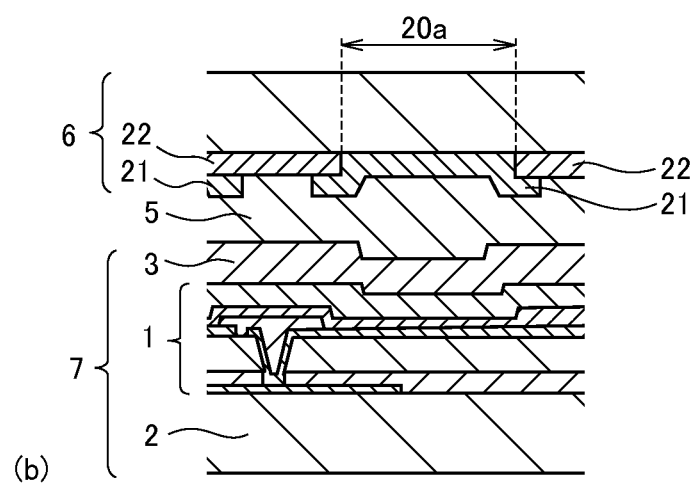
Figure 5:
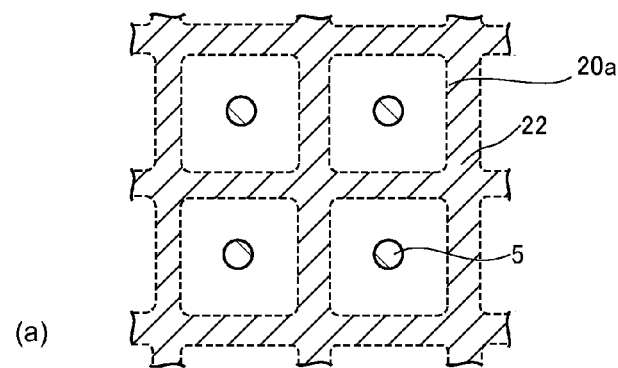
FIG. 5 shows production steps of the organic EL display device in an embodiment according to the present invention.
Figure 5:
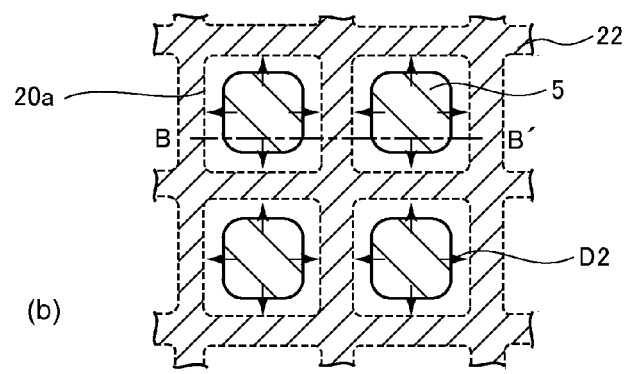
Figure 5:
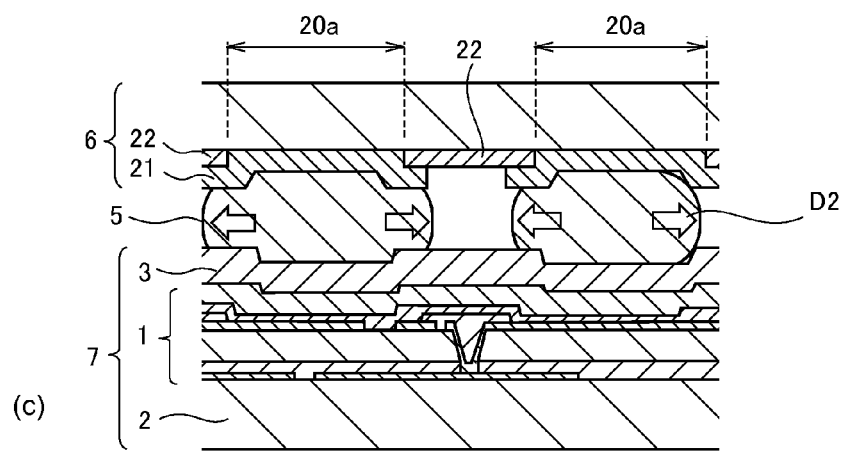
Figure 6:
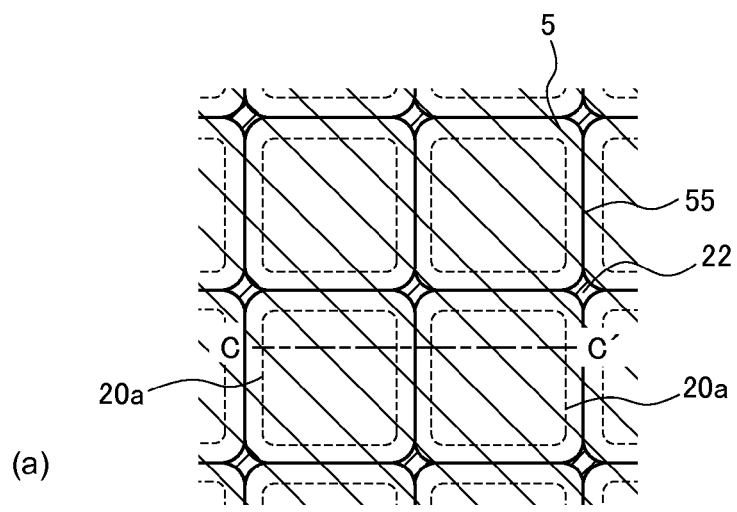
FIG. 6 shows production steps of the organic EL display device in an embodiment according to the present invention.
Figure 6:
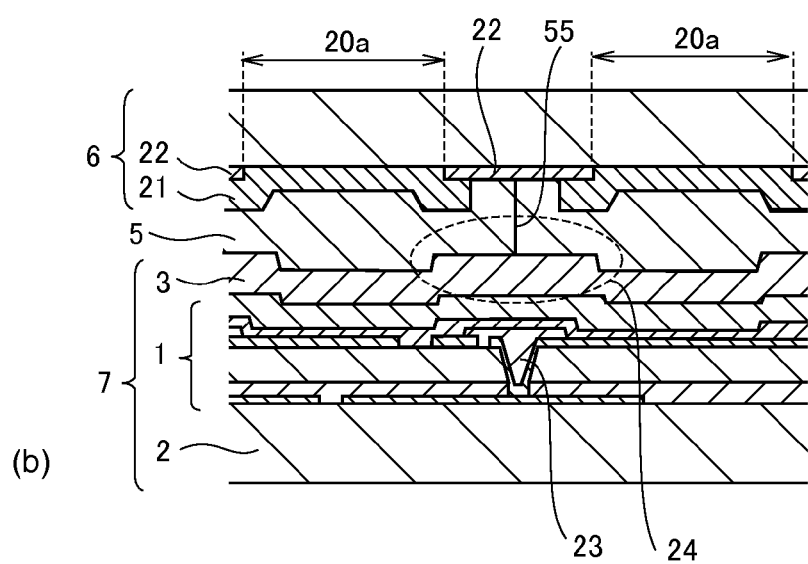

Now, with reference to FIG. 4 through FIG. 6, a part of the step of attaching the substrates in the method for producing the organic EL display device 10 in an embodiment according to the present invention will be described. Specifically, adjustment of dripping positions to which the filler material 5 is to be dripped will be described in more detail. FIG. 4 through FIG. 6 show steps for producing the organic EL display device 10 in an embodiment according to the present invention. FIG. 4 through FIG. 6 show the step of attaching the first substrate 7 and the second substrate 6 for the sake of description. In actuality, however, the production substrate 200 and the like described above are attached together.

FIG. 4(*a*) is a planar see-through view of the organic EL display device 10 showing, with dashed lines, opening areas 20*a* through which light from the organic EL light-emitting layer 1 is transmitted. FIG. 4(*b*) is a cross-sectional view taken along line A-A' in FIG. 4(*a*). FIGS. 5(*a*) and 5(*b*) are each a planar see-through view of the organic EL display device 10 showing a process in which the filler material 5 dripped onto a center part of each of the opening areas 20*a* is pushed and expanded. FIG. 5(*c*) is a cross-sectional view taken along line B-B' in FIG. 5(*b*). FIG. 6(*a*) is a planar see-through view of the organic EL display device 10 showing a state where adjacent dot portions of the filler member 5 are fused together. FIG. 6(*b*) is a cross-sectional view taken along line C-C' in FIG. 6(*a*).

In FIG. 4(*a*), the opening areas 20*a*, which are respectively located in correspondence with the pixels or sub pixels and through which light from the organic EL light-emitting element 1 is transmitted, are represented with dashed quadrangles. An area that demarcates the opening areas 20*a* is shown as a light-blocking area including a black mask 22. As shown in FIG. 4(*b*), a color filter 21 is provided in each opening area 20*a*. In the light-blocking area, the black mask 22, lines of a driving element and the like are provided. As shown in FIG. 4(*b*), the color filter 21 and the black mask 22 are formed in the second substrate 6. The gap between the first substrate 7 and the second substrate 6 is filled with the filler material 5, and thus the first substrate 7 and the second substrate 6 are bonded together.

With reference to FIG. 5 and FIG. 6, the step of dripping the filler material 5 will be described. First, as shown in FIG. 5(*a*), the filler material 5 is dripped onto the center part of each opening area 20*a* by use of a jet dispenser or an inkjet device. For this step, dedicated marks are provided along the perimeter of the production substrate, and the positions to which the filling material 5 is to be dripped are detected based on the marks. In this manner, the filler material 5 can be dripped to desired positions. The opening areas 20*a* shown in FIG. 5 and FIG. 6 correspond to sub pixels included in a pixel. Assuming that the dripping amount of the filler material 5 is 8 pl in the case where the sub pixel pitch is 40 μm, the gap between the substrates 6 and 7 that are bonded together can be about 5 μm.

As shown in FIGS. 5(*b*) and 5(*c*), the filler material 5 dripped to the center part of each opening area 20*a* is pushed and expanded by pushing the first substrate 7 and the second substrate 6 against each other. Since the dripped filler material 5 is supplied with a uniform pressure in this step, the filler material 5 can be pushed and expanded to an area having an equal distance from the center part of each opening area 20*a*. As shown in FIGS. 6(*a*) and 6(*b*), when the filler material 5 is pushed and expanded, the adjacent dot portions of the filler material 5 are fused together, and borders 55 along which the dot portions of the filler material 5 are fused together are superimposed on the light-blocking area.

In this state, as shown in FIG. 6(*b*), a bank layer 23 located at a border line between the pixels or sub pixels prevents shortcircuiting between a pixel electrode and a common electrode included in the organic EL light-emitting layer 1. The bank layer 23 has a protruding shape and thus can be used to prevent the filler material 5 from expanding excessively, so that the borders 55 along which the adjacent dot portions of the filler material 5 are fused together stay within an area superimposed on the light-blocking area.

As shown in FIG. 6(*b*), the common electrode and the sealing film 3 provided on the bank layer 23 are raised to protrude by the thickness of the bank layer 23. As a result, a protrusion 24 is formed in the first substrate 7, at a positon corresponding to each of border lines between the pixels. The protrusion 24 obstructs expansion of the filler material 5 and thus the border 55 of the filler material 5 stays on the protrusion 24. Use of the protrusion 24 makes it easy to control the border 55 of the filler material 5 such that the border 5 stays within an area corresponding to the light-blocking area including the black mask 22.

As can be seen, in the step of dripping the filler material 5 in this embodiment, the positions to which the filler material 5 is to be dripped are determined such that the borders 55 along which the dot portions of the filler material 5 are fused together will be superimposed on the light-blocking area after the substrates are attached together, and then the filler material 5 is dripped. Owing to this, even if the display irregularities 55*z* are caused at the borders 55 of the filler material 5, the display irregularities 55*z* can be made difficult to be visually recognized because the borders 55 are within an area superimposed on the light-blocking area including the black mask 22.

EXAMPLE 1

Figure 7:
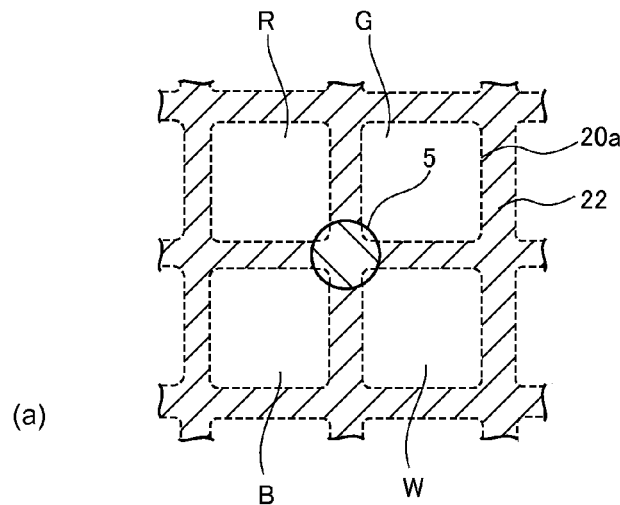
FIG. 7 shows production steps of an organic EL display device in example 1 according to the present invention.
Figure 7:
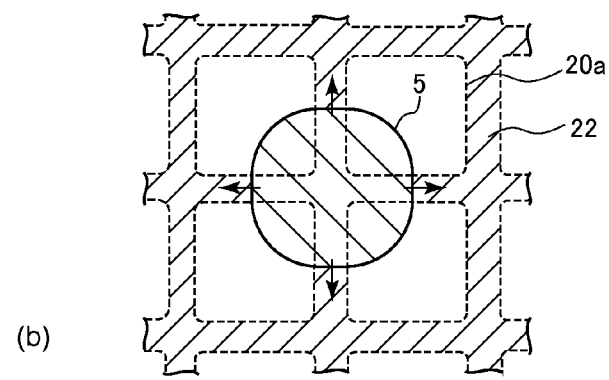
Figure 7:
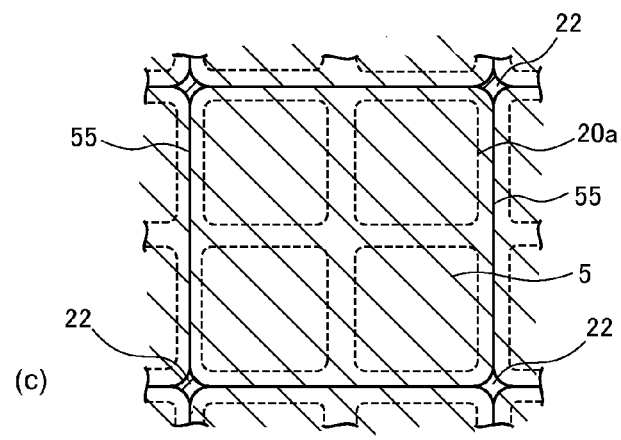

Now, with reference to FIG. 7, a method for producing an organic EL display device 10 in example 1 according to the present invention will be described. FIGS. 7(*a*) through 7(*c*) are each a planar see-through view of the organic EL display device 10, and show a process after the filler material 5 is dripped to a center part of a pixel including four sub pixels, namely, red (R), green (G), blue (B) and white (W) sub pixels. The same steps as those described above with reference to FIG. 4 through FIG. 6 will not be repeated.

The filler material 5 may be dripped at a rate of one dot portion for a plurality of sub pixels. For example, as shown in FIG. 7(*a*), the filler material 5 may be dripped to the center part of a lattice of light-blocking area enclosing four opening areas 20*a* that are respectively located in correspondence with the four sub pixels R, G, B and W. In this case, a uniform pressure is applied to the filler material 5 in the step of attaching the first substrate 7 and the second substrate 6, and as shown in FIG. 7(*b*), the filler material 5 is pushed and expanded to an area having an equal distance from the center part. As a result, as shown in FIG. 7(*c*), the borders 55 along which adjacent dot portions of the filler material 5 are fused together are located in an area corresponding to the light-blocking area including the black mask 22.

In this manner, like by the method for producing the organic EL display device 10 in an embodiment according to the present invention described above with reference to FIG. 4 through FIG. 6, the borders 55 formed by the fusion of the dot portions of the filler material 5 can be controlled to be located in an area superimposed on the light-blocking area including the black mask 22. Therefore, the organic EL display device 10 produced by the method in example 1 according to the present invention does not allow the display irregularities 55z, which may be caused by the borders 55 of the filler material 5, to be visually recognized easily and has improved image quality.

EXAMPLE 2

Figure 8:
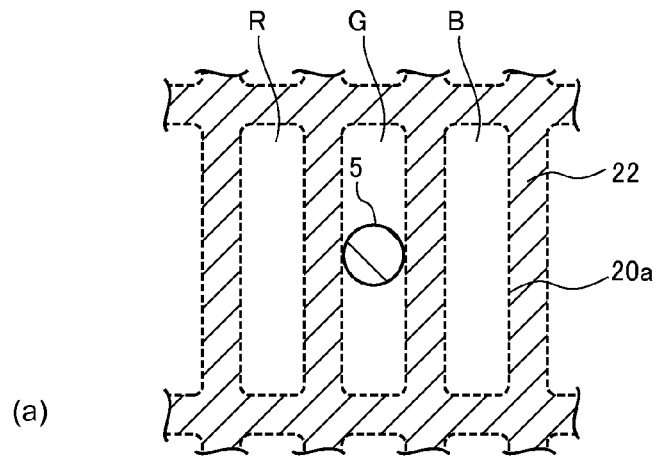
FIG. 8 shows production steps of an organic EL display device in example 2 according to the present invention.
Figure 8:
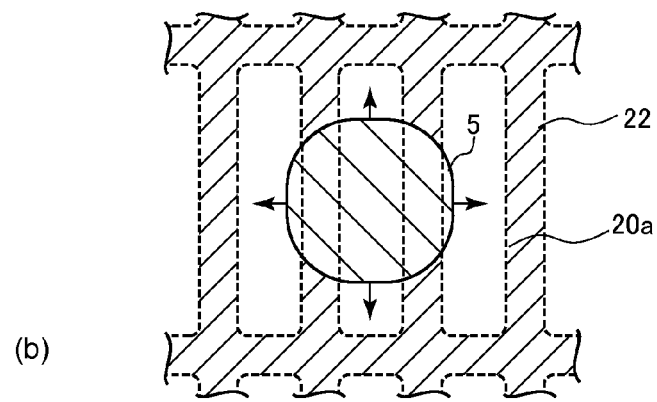
Figure 8:
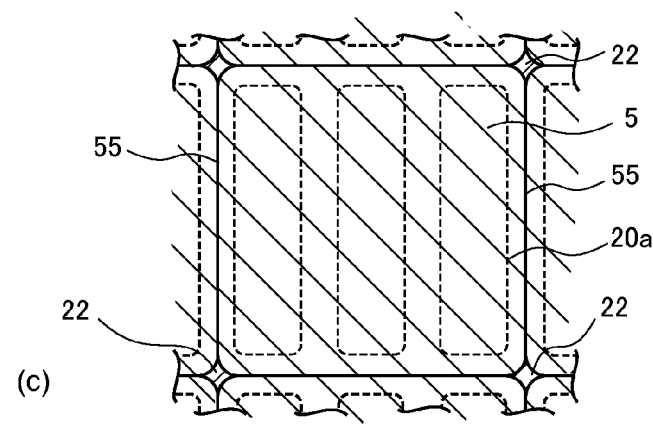
Figure 9:
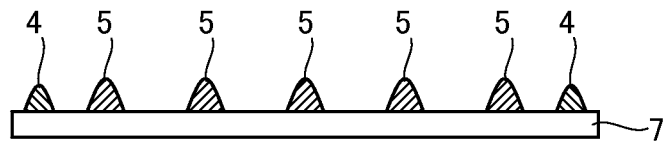
FIG. 9 shows production steps of a conventional organic EL display device.
Figure 9:
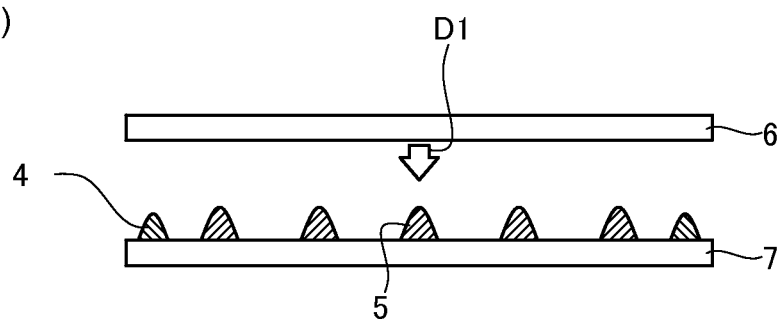
Figure 9:
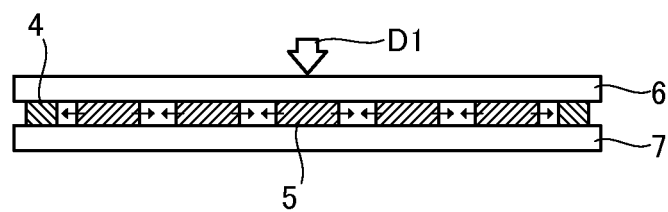
Figure 9:
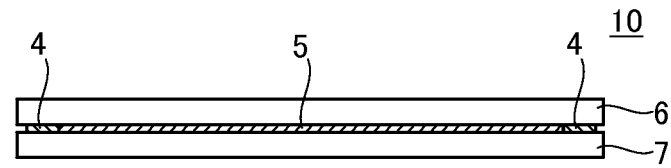

Now, with reference to FIG. 8, a method for producing an organic EL display device 10 in example 2 according to the present invention will be described. FIGS. 8(a) through 8(c) are each a planar see-through view of the organic EL display device 10, and show a process after the filler material 5 is dripped to a center part of a pixel including three sub pixels, namely, red (R), green (G) and blue (B) sub pixels. The same steps as those described above with reference to FIG. 4 through FIG. 6 will not be repeated.

Even in the case where the sub pixels R, G and B are each of a lengthy rectangle as shown in FIG. 8(a), the filler material 5 may be dripped to a center part of each pixel including three sub pixels R, G and B. In this case, a uniform pressure is applied to the filler material 5 in the step of attaching the first substrate 7 and the second substrate 6, and as shown in FIG. 8(b), the filler material 5 is pushed and expanded to an area having an equal distance from the center part. As a result, as shown in FIG. 8(c), the borders 55 generated by the fusion of the dot portions of the filler material 5 are located in an area corresponding to the light-blocking area including the black mask 22.

In this manner, like by the method for producing the organic EL display device 10 in an embodiment according to the present invention described above with reference to FIG. 4 through FIG. 6, the borders 55 formed by the fusion of the dot portions of the filler material 5 can be controlled to be located in an area superimposed on the light-blocking area including the black mask 22. Therefore, the organic EL display device 10 produced by the method in example 2 according to the present invention does not allow the display irregularities 55z, which may be caused by the borders 55 of the filler material 5, to be visually recognized easily and has improved image quality.

As described above, according to the method for producing the organic EL display device 10 in an embodiment according to the present invention, the dripping pitch of the filling material 5 can be decreased by use of an existing jet dispenser or inkjet device, and therefore the display irregularities 55z that may be visually recognized can be alleviated. In addition, since the first substrate 7 and the second substrate 6 may be formed with a narrow gap therebetween, color mixing in the pixels can be prevented. Therefore, the resultant organic EL display device 10 can have improved image quality, and can be produced by a simplified method at lower production cost.

Also, according to the method for producing the organic EL display device 10 in an embodiment according to the present invention, the filler material 5 is dripped such that the borders 55 formed by the fusion of the dot portions of the filler material 5 will be located in an area corresponding to the light-blocking area. Therefore, the display irregularities 55z, even when being caused, can be prevented from being visually recognized. The present invention provides an organic EL display device 10 that has improved image quality, realizes high definition display, and is produced at low cost; and a method for producing such an organic EL display device 10.

What is claimed is:

1. An organic EL display device, comprising:
   a first substrate including a display area in which a plurality of pixels including an organic EL light-emitting layer are arrayed, the plurality of pixels each having a plurality of sub pixels;
   a second substrate that faces the first substrate and includes a plurality of opening areas each respectively located in correspondence with the plurality of sub pixels and a light-blocking area that demarcates the opening areas;
   a dam material provided between the first substrate and the second substrate so as to enclose the display area; and
   a filler material filling a space enclosed by the first substrate, the second substrate and the dam material;
   wherein:
   the light-blocking area includes an outer region and a center region;
   the outer region surrounds one pixel of the plurality of pixels;
   the center region is located inside the outer region and demarcates the opening areas;
   the filler material includes borders generated as a result of a plurality of portions of the filler material being fused together; and
   the borders of the filler material are located in an area corresponding to the outer region, and are not located in an area corresponding to the center region.

2. The organic EL display device according to claim 1, wherein:
   the opening areas each include a color filter; and
   the light-blocking area includes a black mask.

3. The organic EL display device according to claim 1, wherein the borders of the filler material enclose the opening areas.

4. The organic EL display device according to claim 1, wherein an ultraviolet-curable resin is used as the dam material, and a thermosetting resin is used as the filler material.

5. The organic EL display device according to claim 1, wherein:
   the one pixel of the plurality of pixels includes four sub pixels,
   the center region includes a first part and a second part,
   the first part extends in a first direction, and
   the second part crosses the first part and extends in a second direction different from the first direction.

6. The organic EL display device according to claim 1, wherein:
   the one pixel of the plurality of pixels includes a plurality of sub pixels arranged in a first direction,
   the center region includes a plurality of parts extending in a second direction different from the first direction, and arranged in the first direction.

* * * * *